US008823611B2

(12) United States Patent
 Coleman

(10) Patent No.: US 8,823,611 B2
(45) Date of Patent: Sep. 2, 2014

(54) PORTABLE FRAME-LESS REVERSIBLE LUMINOUS SUCTION CUP DISPLAY

(75) Inventor: Charles Thomas Coleman, Ocean Springs, MS (US)

(73) Assignee: Golconda Holdings, LLC, Gulfport, MS (US)

( * ) Notice: Subject to any disclaimer, the term of this patent is extended or adjusted under 35 U.S.C. 154(b) by 153 days.

(21) Appl. No.: 13/490,565

(22) Filed: Jun. 7, 2012

(65) Prior Publication Data

US 2013/0328751 A1    Dec. 12, 2013

(51) Int. Cl.
*G09G 3/30*    (2006.01)
(52) U.S. Cl.
USPC ............................................................ 345/76
(58) Field of Classification Search
None
See application file for complete search history.

(56) References Cited

U.S. PATENT DOCUMENTS

| 7,065,909 | B2* | 6/2006 | Snyder | 40/544 |
| 2001/0004808 | A1* | 6/2001 | Hurwitz | 36/137 |
| 2003/0074820 | A1* | 4/2003 | Fink | 40/597 |
| 2006/0049954 | A1* | 3/2006 | Mohamed | 340/692 |

* cited by examiner

*Primary Examiner* — Nicholas Lee
(74) *Attorney, Agent, or Firm* — Valenti, Hanley & Robinson, PLLC; Kevin T. Duncan

(57) ABSTRACT

The invention provides a frameless, lightweight, bright light, portable display in the form of electroluminescence with multiple reversible mounting suction cups. The luminous unit comes in various sizes of which most are round in shape. Each unit contains a power plug, inverter, and the electroluminescent panel. However, each unit also includes a minimum of 3 suction cup extensions allowing for the unit to be reversible. This unit is able to be mounted on the inside of a window or the outside of a window/hard slick surface with the light facing same direction no matter which side of the glass it is mounted thereon.

2 Claims, 5 Drawing Sheets

PORTABLE FRAME-LESS REVERSIBLE LUMINOUS SUCTION CUP DISPLAY

CROSS-REFERENCE TO RELATED APPLICATIONS

Not Applicable

STATEMENT REGARDING FEDERALLY SPONSORED RESEARCH

"Not Applicable"

Figure 1:
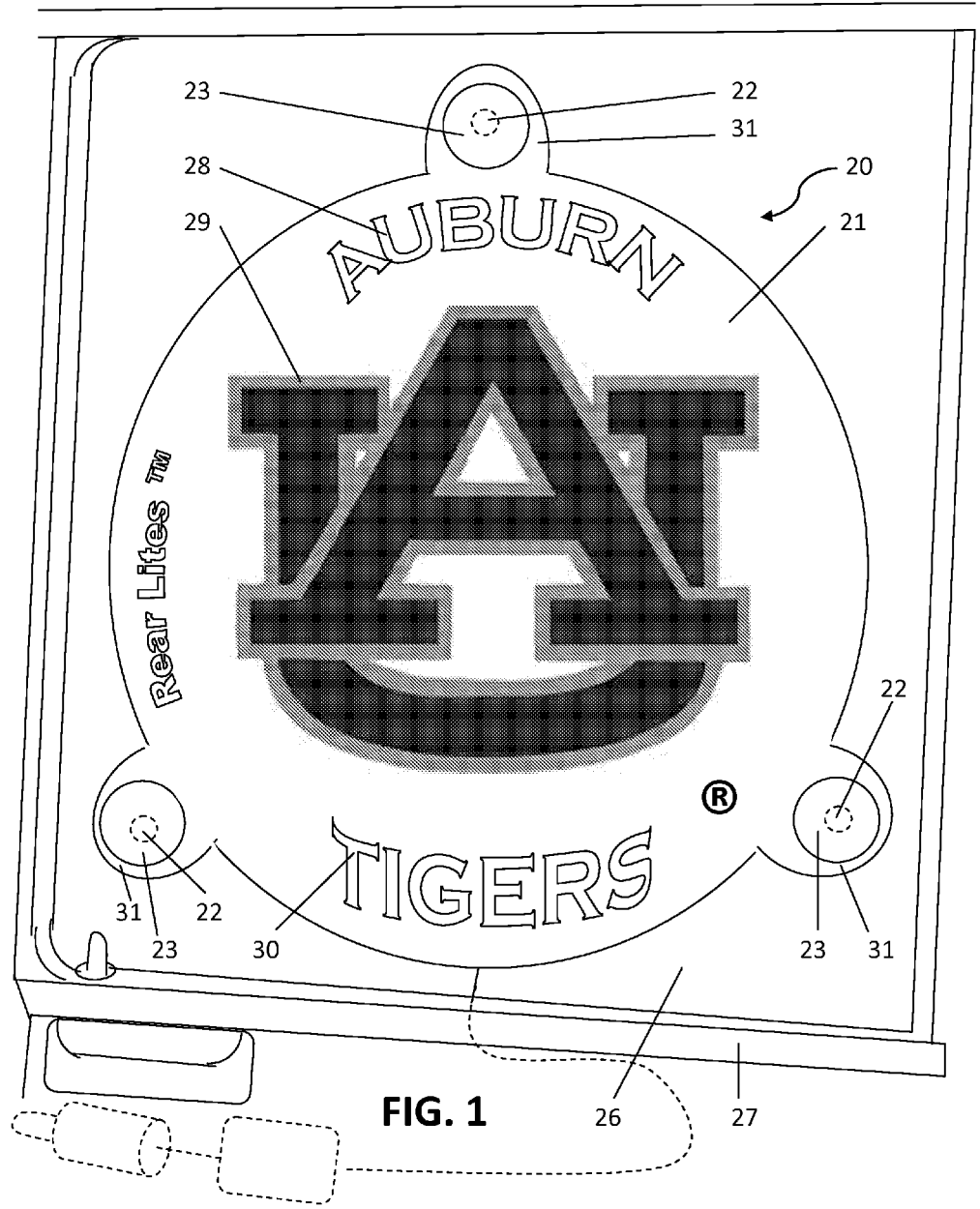

REFERENCE TO SEQUENCE LISTING, A TABLE, OR A COMPUTER PROGRAM, LISTING COMPACT DISC APPENDIX

"Not Applicable"

BACKGROUND OF THE INVENTION

1. Field of Invention

This invention relates generally to luminous displays, e.g., electroluminescent, OLED, LED, etc. that are mounted by attachment type adapters to structures, e.g., windows for auto or home, mirrors, or any comparable surface.

2. Description of Related Art

The prior art includes various patents disclosing electroluminescent panels for use in or on vehicles to provide a visual display of graphics and/or text. The use of electroluminescent devices to produce animated displays is shown in various United States patents. Examples include U.S. Pat. No. 4,494,326 (Kanamori) discloses a vehicle window marker light for displaying a corporate/company, model logo.

U.S. Pat. No. 4,465,970 (Murphy) discloses a vehicle window marker light for displaying a corporate/company, model logo.

U.S. Pat. No. 5,005,306 (Kinstler) discloses an electroluminescent removable vehicle door or vehicle body sign. Flexible in nature and powered by vehicles electrical system.

U.S. Pat. No. 5,516,387 (Hoffman) discloses an electroluminescent back lighted stencil sign for vehicle windows. The sign is capable of removable indicia and displays from outside the vehicle window.

U.S. Pat. No. 5,566,384 (Chien) discloses electroluminescent panels for its illumination. It uses power packs and an adhesive for mounting.

U.S. Pat. No. 6,056,425 (Apellberg) discloses an electroluminescent panel back lighted sign for roof mounted type assembly, e.g., the sign exhibits the word "TAXI" for indicia.

U.S. Pat. No. 6,224,224 (Bear) discloses a signboard with luminous properties with sequenced patterns and/or text.

U.S. Pat. No. 3,573,532 (Hudson) discloses an electroluminescent display using electrodes as a monolithic structure.

U.S. Pat. No. 4,195,431 (Neufeld) discloses an electroluminescent back lighted booklike source displaying indicia representative of graphics.

U.S. Pat. No. 7,065,909 (Snyder) discloses an electroluminescent display device for use of vehicle windows or businesses or on garments. The device uses electroluminescent OLED, LCD, or LED panels. It has an associated driver control unit. Its driver is predetermined to produce an animated display of graphics or text.

BRIEF SUMMARY OF THE INVENTION

Portable Frame-less Reversible Luminous Suction Cup Display, e.g., electroluminescent display device to include, electroluminescent panel, power control inverter, AC/DC converter (12 VDC or 110 VAC), releasable reversible securable means, e.g., 3 reversible suction cups.

The first frameless electroluminescent truly thin reversible sign, e.g., front display on thin light weight vinyl exhibits graphic areas. The unit can be plugged into AC or DC connectors.

The unit is arranged to be illuminated when AC or DC current is applied, e.g., plugged into a home wall or vehicle power plug, e.g., flash or no flash colored graphics.

The first electroluminescent light with releasable reversible mounts, e.g., suction cups, are arranged almost equidistant onto the light source itself to secure the device onto support object, e.g., window of vehicle or store window or reversible, e.g., mounted on mirror with reversing suction cups so that graphic areas are visible to viewers.

DETAILED DESCRIPTION OF THE INVENTION

Specification: Petitioner has invented a new, original, and ornamental design entitled "Rear Lites" for portable frameless luminous vinyl/plastic flat panel display arranged to be mounted on various items, such as windows of vehicles or homes with windows/ mirrors. The device includes a luminous display panel, e.g., an electroluminescent, OLED, LCD or LED panel, and an associated inverter/control unit. The display panel can be made of various luminous logos, numbers, and letters arranged to be illuminated in a predetermined pattern and sequence by the inverter/control unit to produce a luminous display. The vinyl plastic flat panel display is unique in its three (3) reversible suction cup design. Reversible suction cups allow the flat panel to be mounted on either side of a window. Reference is made to the accompanying drawings which form a part hereof, the figures of which are described below.

BREIF DESCRIPTION OF DRAWING FIGURES

FIG. 1 is an elevation view of my new light design

Figure 2:
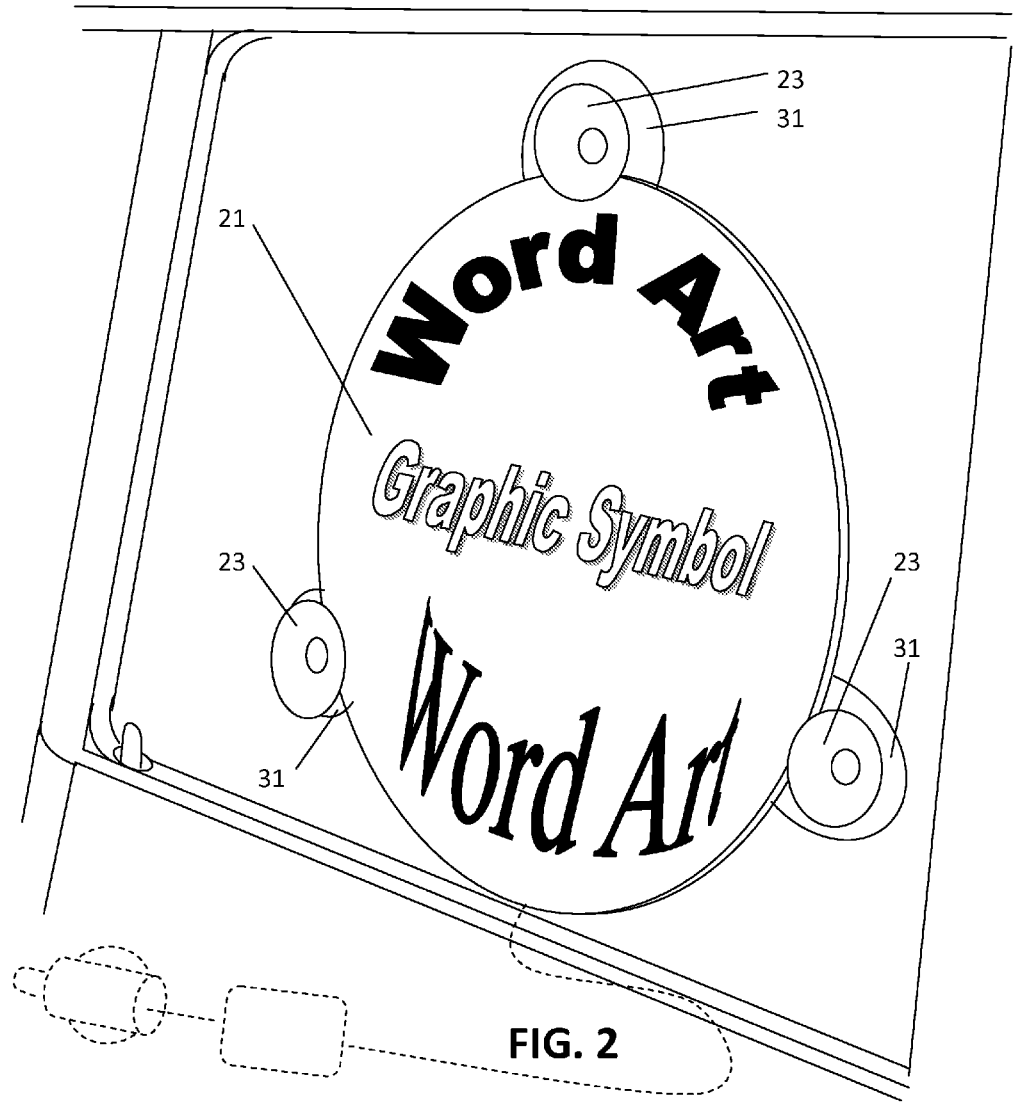

FIG. 2. is a perspective view of my new light design

Figure 3:
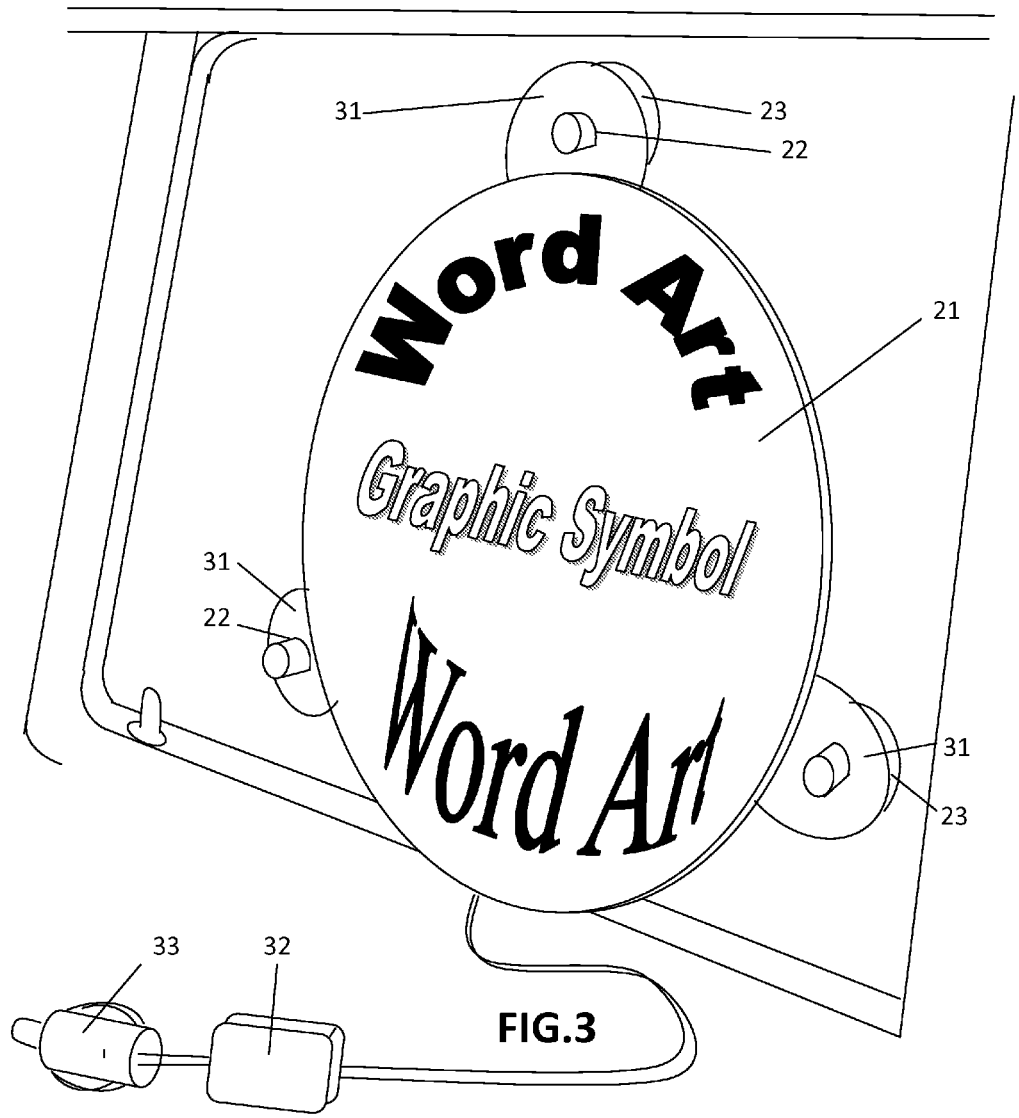

FIG. 3. is a perspective view of my new light design reversed

Figure 4:
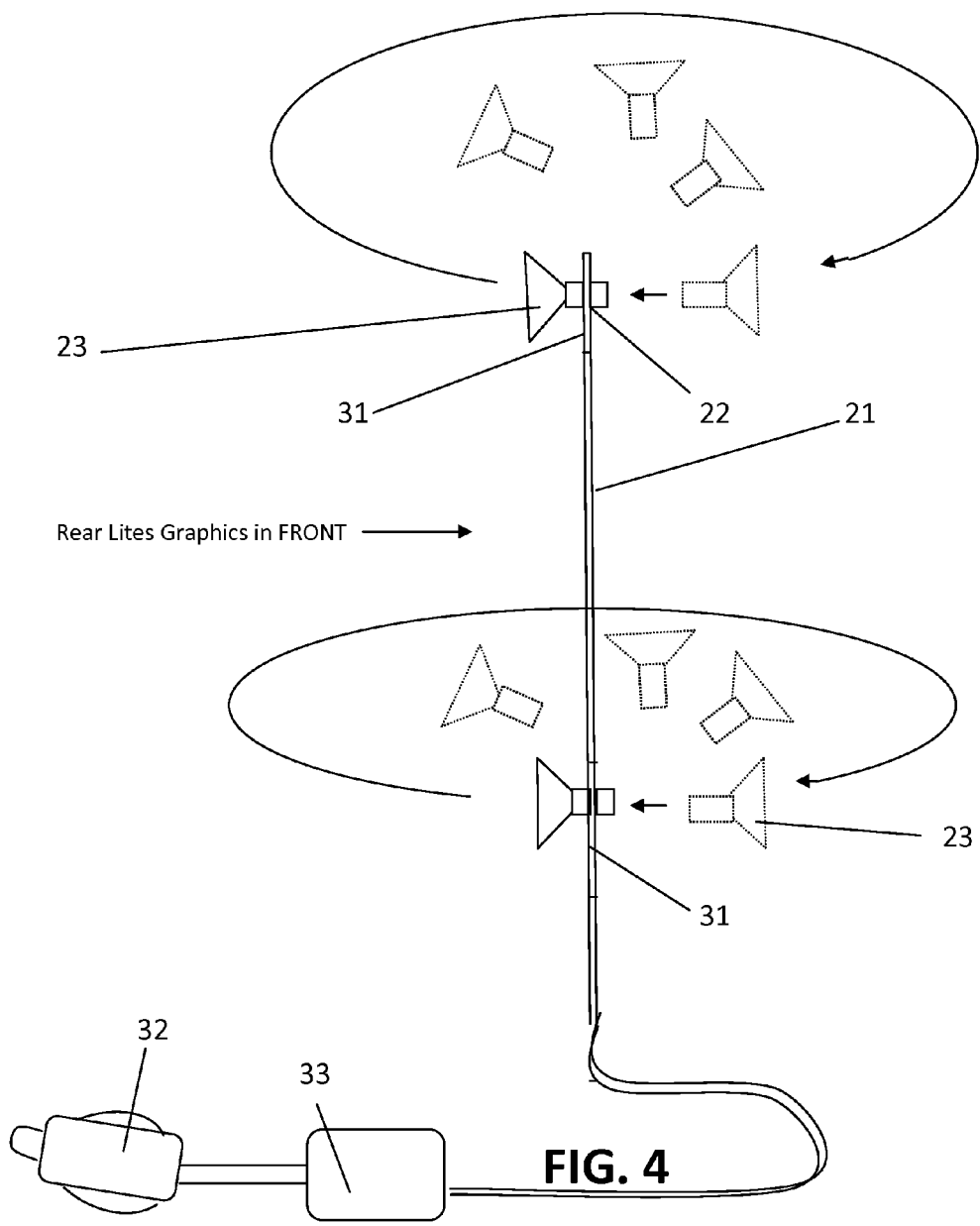
Figure 5:
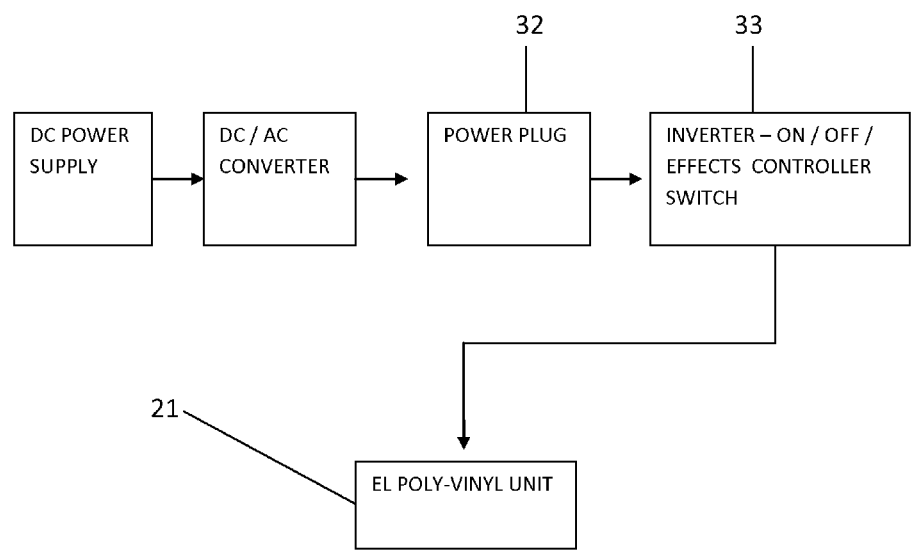

FIG. 4 is a side view of my new light design illustrating the reversible suction cups FIG. 5 is a schematic of the electrical circuit for unit shown in FIG. 1-4

DETAILED DESCRIPTION OF THE DRAWING

In the advantageous design of the invention illustrated by FIG. 1, the electroluminescent frameless lightweight vinyl panel 21 comprises three permanent extenders 31(one upper and two lower), which house the mounting device 23. The suction cup mounts are connected to either side of the polymeric, typically polyvinyl chloride panel 21 through holes 22 in the extensions 31.

All suction cups mounts 23 and extenders 31 are identical in function and can rotate by manually moving from front to back, as seen in FIG. 4, with reinforced extensions 31. As seen in FIG. 2, the unit is placed on the inside of an auto glass for display. FIG. 3 however, is placed on the outside of the auto glass displayed in same direction after suction cups are uniquely reversed.

Rear Lites™ separates itself from previous related art for example, U.S. Pat. No. 7,065,909 (Snyder), uses very bulky framing and has no mention of reversible mounts which is impossible because of the bulky backside frame and battery pack. This also subsequent in U.S. Pat. No. 3,573,532 (Hudson), where a monolithic structure is used for display purposes.

U.S. Pat. No. 5,566,384 (Chien) related art uses EL strips in sleeves and other embodiment of EL. There is no mention of how the mounting works, adhesion practices, or use in the home for this related art.

Referring to FIG. 1, the EL unit 20 is displayed by polyvinyl 21 behind an auto glass 26 of a vehicle frame 27.

Referring to FIGS. 3, 4, and 5, the said unit is powered by DC 12 volt current or converted to AC 110 current by a common adapter, then by wire, connected to the power plug 32, and then, by wire, connected to inverter 33, then by wire, connected to the display poly-vinyl unit 21.

The function interface of the inverter 33 has a plethora of options which include, on, off, flash, and sometimes a combination of flash or fading in and out. The housing of the inverter consists of a common hard plastic cover with electronics encased. The power plug 32, commonly referred to as a cigarette lighter plug is used as the voltage connector. It is a common piece in the market place.

The flexible poly-vinyl unit 21 is a silk screen procedure using phosphorous inks excited by copper or zinc when power is supplied. FIG. 1 displays 28, 29, and 30 as the sample graphics to be lighted. Silk screened graphics with EL is a common practice or procedure.

Referring to FIG. 2, the poly-vinyl unit 21 displays the said unit behind auto glass in three dimensional configurations. FIG. 3, shows unit displayed with the graphics facing in the same direction, just opposite side of auto glass. FIG. 4 illustrates the mounts 23 being removed from permanent extenders 31 through holes 22 and reversed to reassert the mounts 23 back into holes 22 of the permanent extenders 31.

The invention claimed is:

1. An Electroluminescent (EL) frameless vinyl display for vehicles or home use comprising:
   at least one vinyl display;
   a circuit that includes a DC/AC converter and DC power plug;
   a switch controlled electrical inverter that allows user multiple options on display of flash, constant on, and sequences of different flash options of pre-determined messages, logos, numbers, letters; and
   wherein the unit or vinyl display is frameless and not encased in any form, structure, or housing.

2. An Electroluminescent (EL) frameless vinyl display as recited in 1 wherein detachable mounts can be reversed so that said unit can be mounted behind or in front of a glass structure with the light facing same direction no matter which side of the glass it is mounted thereon.

* * * * *